United States Patent
Tamada et al.

(10) Patent No.: US 9,376,594 B2
(45) Date of Patent: Jun. 28, 2016

(54) POLISHING COMPOSITION

(71) Applicant: FUJIMI INCORPORATED, Kiyosu-shi, Aichi (JP)

(72) Inventors: Shuichi Tamada, Kiyosu (JP); Satoru Yarita, Kiyosu (JP)

(73) Assignee: FUJIMI INCORPORATED, Kiyosu-Shi (JP)

( * ) Notice: Subject to any disclaimer, the term of this patent is extended or adjusted under 35 U.S.C. 154(b) by 0 days.

(21) Appl. No.: 14/385,298

(22) PCT Filed: Mar. 11, 2013

(86) PCT No.: PCT/JP2013/056636
§ 371 (c)(1),
(2) Date: Sep. 15, 2014

(87) PCT Pub. No.: WO2013/137192
PCT Pub. Date: Sep. 19, 2013

(65) Prior Publication Data
US 2015/0069016 A1  Mar. 12, 2015

(30) Foreign Application Priority Data
Mar. 16, 2012  (JP) .................... 2012-061156

(51) Int. Cl.
*H01L 21/302* (2006.01)
*C09G 1/02* (2006.01)
*H01L 21/321* (2006.01)
*H01L 21/306* (2006.01)
*H01L 21/02* (2006.01)
*C09K 3/14* (2006.01)
*C23F 1/30* (2006.01)
*C23F 1/40* (2006.01)
*C23F 3/02* (2006.01)

(52) U.S. Cl.
CPC ............... *C09G 1/02* (2013.01); *C09K 3/1409* (2013.01); *C09K 3/1436* (2013.01); *C09K 3/1463* (2013.01); *C23F 1/30* (2013.01); *C23F 1/40* (2013.01); *C23F 3/02* (2013.01); *H01L 21/02024* (2013.01); *H01L 21/30625* (2013.01); *H01L 21/3212* (2013.01)

(58) Field of Classification Search
CPC ............... C23F 1/30; C23F 1/32; C23F 1/40; C09G 1/00; C09G 1/02; C09G 1/04; H01L 21/31053; H01L 21/31051; H01L 21/3212; H01L 21/32132; H01L 21/0202
USPC .............. 252/79.1, 79.2, 79.3, 79.4; 438/691, 438/692, 693, 694
See application file for complete search history.

(56) References Cited

U.S. PATENT DOCUMENTS

| | | | |
|---|---|---|---|
| 5,691,272 A * | 11/1997 | Matsumoto et al. | 503/217 |
| 5,885,362 A | 3/1999 | Morinaga et al. | |
| 6,096,652 A * | 8/2000 | Watts et al. | 438/692 |
| 6,224,785 B1 | 5/2001 | Wojczak et al. | |
| 6,612,911 B2 | 9/2003 | Carter et al. | |
| 7,153,767 B2 * | 12/2006 | Nishikawa et al. | 438/634 |
| 7,229,570 B2 * | 6/2007 | Taiji et al. | 252/79.1 |
| 7,897,061 B2 | 3/2011 | Dysard et al. | |
| 8,026,164 B2 * | 9/2011 | Takesako et al. | 438/618 |
| 8,338,302 B2 | 12/2012 | Schwandner et al. | |
| 8,518,296 B2 * | 8/2013 | Lu et al. | 252/79.4 |
| 2001/0037821 A1 | 11/2001 | Staley et al. | |
| 2001/0050350 A1 | 12/2001 | Wojczak et al. | |
| 2003/0082998 A1 | 5/2003 | Carter et al. | |
| 2004/0021125 A1 | 2/2004 | Taiji et al. | |
| 2004/0132308 A1 * | 7/2004 | Obeng | 438/692 |
| 2007/0049025 A1 * | 3/2007 | Siddiqui et al. | 438/687 |
| 2007/0178700 A1 | 8/2007 | Dysard et al. | |
| 2008/0190035 A1 * | 8/2008 | Lu et al. | 51/307 |
| 2010/0112728 A1 | 5/2010 | Korzenski et al. | |
| 2010/0130012 A1 | 5/2010 | Schwandner et al. | |
| 2011/0073800 A1 | 3/2011 | Wang et al. | |
| 2011/0117740 A1 | 5/2011 | Martinez et al. | |

FOREIGN PATENT DOCUMENTS

| | | |
|---|---|---|
| JP | 09-082676 A | 3/1997 |
| JP | 2003-530227 A | 10/2003 |
| JP | 2004-067762 A | 3/2004 |
| JP | 2004-529488 A | 9/2004 |
| JP | 2005-502734 A | 1/2005 |
| JP | 2005-070118 A | 3/2005 |
| JP | 2009-525615 A | 7/2009 |
| JP | 2010-130009 A | 6/2010 |
| JP | 2010-519740 A | 6/2010 |
| JP | 2011-082512 A | 4/2011 |
| TW | 200908148 A | 2/2009 |
| WO | WO 02/077120 A1 | 10/2002 |

(Continued)

*Primary Examiner* — Lan Vinh
(74) *Attorney, Agent, or Firm* — Foley & Lardner LLP

(57) ABSTRACT

There is provided a polishing composition capable of suppressing formation of a stepped portion caused by etching of a surface of a polishing object including a portion containing a group IV material when the polishing object is polished. The present invention relates to a polishing composition for polishing of a polishing object including a portion that contains a group IV material, and the polishing composition contains an oxidizing agent and an anticorrosive agent. Preferably, the anticorrosive agent includes at least one selected from the group consisting of compounds in which two or more carbonyl groups contained in a molecule are bonded through a carbon atom in the molecule. To be more specific, preferably, the anticorrosive agent includes at least one selected from the group consisting of a 1,3-diketone compound, a 1,4-diketone compound, and a triketone compound.

9 Claims, No Drawings

POLISHING COMPOSITION

TECHNICAL FIELD

The present invention relates to a polishing composition for polishing of a polishing object including a portion that contains a group IV material. Further, the present invention relates to a polishing method using the polishing composition, and a manufacturing method of a substrate.

BACKGROUND ART

As one of techniques for reducing power consumption or improving performance (operation characteristic) of a transistor, a high-mobility channel material that increases mobility of carriers has been examined. At a channel improved in carrier transport property, a drain current in an ON state can be increased. Therefore, it is possible to sufficiently obtain an ON-state current and also possible to reduce a power supply voltage. This combination brings about higher performance of a MOSFET (metal oxide semiconductor field-effect transistor) with low power consumption.

Compounds from group III-V, compounds from group IV, Ge (germanium), and graphene containing only C (carbon) have been expected to be used as high-mobility channel materials. At present, in the case of forming a channel of the compounds from group III-V, there is a problem that a technique of improving crystallinity of the channel and readily controlling and growing a shape of the channel has not been established. Therefore, the compounds, particularly SiGe and Ge, from group IV easy to employ as compared with the compounds from group III-V have been actively examined.

A channel using a high-mobility material can be formed by polishing a polishing object including a group IV compound channel, and/or a Ge channel (herein after, sometimes referred to as "Ge material portion") and a portion that contains a silicon material (herein after, sometimes referred to as "silicon material portion"). In this case, along with polishing of the Ge material portion at a high polishing rate, it is required not to form a stepped portion caused by etching of a polished surface of the polishing object. However, polishing compositions, which have been conventionally used for polishing a Ge substrate, as described in, for example, JP 2010-130009A or JP 2010-519740W (US2011/0117740 (A1)) have been developed for Ge substrate. Therefore, in the case of using such compositions for polishing a polishing object including a Ge material portion and other portions, the Ge material portion may be excessively polished and etched. Thus, it is difficult to prevent formation of a stepped portion caused by etching of a polished surface of the polishing object.

SUMMARY OF INVENTION

In view of the foregoing, an object of the present invention is to provide a polishing composition capable of suppressing formation of a stepped portion caused by etching of a surface of a polishing object including a portion that contains a group IV material such as Ge when the polishing object is polished, and also to provide a polishing method using the polishing composition, and a manufacturing method of a substrate.

In order to achieve the object described above, according to a first aspect of the present invention, there is provided a polishing composition for polishing of a polishing object including a portion that contains a group IV material, and the polishing composition contains an oxidizing agent and an anticorrosive agent.

According to a second aspect of the present invention, there is provided a polishing method for polishing a polishing object including a portion that contains a group IV material by using the polishing composition of the first aspect.

According to a third aspect of the present invention, there is provided a manufacturing method of a substrate including a portion that contains a group IV material, and the manufacturing method comprises a polishing process by the polishing method of the second aspect.

DESCRIPTION OF EMBODIMENTS

Hereinafter, an exemplary embodiment of the present invention will be explained.

A polishing composition of the present exemplary embodiment is prepared by mixing an oxidizing agent and an anticorrosive agent with water. Therefore, the polishing composition contains the oxidizing agent and the anticorrosive agent. If a polishing object including a portion that contains a group IV material is polished by using polishing composition with such a composition, it is possible to suppress formation of a stepped portion caused by etching of a surface of the polishing object.

This polishing composition is used for polishing a polishing object including a portion that contains a group IV material and additionally for manufacturing a substrate by polishing the polishing object. The polishing object may further include a silicon material portion. Examples of the group IV material may include germanium (Ge), SiGe (silicon germanium), and the like. Further, examples of the silicon material may include poly silicon, silicon oxide, silicon nitride, and the like.

(Oxidizing Agent)

An oxidizing agent contained in the polishing composition is not specifically limited in kind, and preferably has a standard electrode potential of 0.3 V or more. In the case of using an oxidizing agent having a standard electrode potential of 0.3 V or more, it is advantageous in that a speed of polishing of a portion that contains a group IV material with the polishing composition is improved, as compared with the case of using an oxidizing agent having a standard electrode potential of less than 0.3 V. To be specific, examples of the oxidizing agent having a standard electrode potential of 0.3 V or more may include hydrogen peroxide, sodium peroxide, barium peroxide, organic oxidizing agents, ozone water, silver (II) salts, iron (III) salts, permanganic acid, chromic acid, dichromic acid, peroxo disulfuric acid, peroxo phosphoric acid, peroxo sulfuric acid, peroxo boraic acid, peroxyformic acid, peracetic acid, perbenzoic acid, perphthalic acid, hypochlorous acid, hypobromous acid, hypoiodous acid, chloric acid, chlorous acid, perchloric acid, bromic acid, iodic acid, periodic acid, sulfuric acid, persulfuric acid, citric acid, dichloroisocyanuric acid, and salts thereof. Among them, considering a significant improvement in speed of polishing of a portion that contains a group IV material with a polishing composition, hydrogen peroxide, ammonium persulfate, hypochlorous acid, sodium hypochlorite, periodic acid, and sodium dichloroisocyanurate may be particularly preferable.

Meanwhile, a standard electrode potential is represented by the following Mathematical Equation 1 when all chemical species involved in an oxidation reaction are in a standard state.

[Equation 1]

$$E0 = -\Delta G0/nF = (RT/nF)\ln K \qquad \text{Mathematical Equation 1}$$

Herein, E0 represents a standard electrode potential, $\Delta G0$ represents a change in standard gibbs energy of the oxidation reaction, K represents an equilibrium constant thereof, F represents the Faraday constant, T represents an absolute temperature, and n represents the number of electrons involved in the oxidation reaction. As it can be clearly seen from Mathematical Equation 1, a standard electrode potential varies depending on a temperature. In the present specification, a standard electrode potential at 25° C. is employed. Meanwhile, a standard electrode potential in an aqueous solution system is described in, for example, the fourth edition of Chemical Manual (Basics) II, pp 464-468 (edited by Chemical Society of Japan).

An amount of the oxidizing agent contained in the polishing composition is preferably 0.00001 mol/L or more, and more preferably 0.001 mol/L or more. As an amount of the oxidizing agent is increased, a speed of polishing of a portion that contains a group IV material with the polishing composition is improved.

Also, an amount of the oxidizing agent contained in the polishing composition is preferably 100 mol/L or less, more preferably 50 mol/L or less, still more preferably 10 mol/L or less, and most preferably 1 mol/L or less. As an amount of the oxidizing agent is decreased, it is possible to reduce the cost of materials of the polishing composition and also possible to reduce a load of treatment of the polishing composition after used for polishing, that is, treatment of waste water.

(Anticorrosive Agent)

An anticorrosive agent contained in the polishing object is not specifically limited in kind, and preferably include at least one selected from the group consisting of compounds in which two or more carbonyl groups contained in a molecule are bonded through a carbon atom. With a conventional polishing composition, a portion that contains a group IV material is excessively etched with an additive (particularly, a complexing agent) of the polishing composition. Meanwhile, particularly, in the case of using the polishing composition using a compound, in which two or more carbonyl groups contained in a molecule are bonded through a carbon atom, as an anticorrosive agent according to the present exemplary embodiment, it is deemed that a group IV material is bonded to the two or more carbonyl groups contained in a molecule of the anticorrosive agent, and, thus, an insoluble complex is formed and an insoluble brittle film is formed. As a result, it is deemed that excessive etching of the group IV material with the additive (particularly, the complexing agent) of the conventional polishing composition can be suppressed, and, thus, it is possible to suppress formation of a stepped portion caused by etching at a surface of a polishing object. Meanwhile, the above-described mechanism is based on assumption, and the present exemplary embodiment is not limited to the mechanism.

Examples of the compound in which two or more carbonyl groups contained in a molecule are bonded through a carbon atom in the molecule may include a diketone compound represented by the following Formula (1).

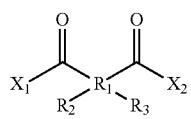

(1)

(Herein, in Formula (1), $R_1$ represents a linear or branched alkylene group having 1 to 4 carbon atoms, $R_2$ and $R_3$, independently, represent a hydrogen atom, a halogen atom, a linear, branched, or cyclic alkyl group having 1 to 10 carbon atoms with or without a substituent, a hydroxymethyl group, a hydroxyethyl group, or an aryl group having 6 to 20 carbon atoms with or without a substituent, and $X_1$ and $X_2$, independently, represent a hydrogen atom, a halogen atom, a linear, branched, or cyclic alkyl group having 1 to 10 carbon atoms with or without a substituent, a hydroxymethyl group, a hydroxyethyl group, or an aryl group having 6 to 20 carbon atoms with or without a substituent, a functional group (1) below, or a functional group (2) below. Herein, one or more sets from $R_2$ and $X_1$, $R_2$ and $R_3$, and $R_3$ and $X_2$ may be bonded directly or through a carbon atom so as to form a cyclic structure.)

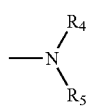

Functional group (1)

Functional group (2)

(Herein, $R_4$ and $R_5$ of the functional group (1) and $R_6$ of the functional group (2), independently, represent a hydrogen atom, a halogen atom, a linear, branched, or cyclic alkyl group having 1 to 10 carbon atoms with or without a substituent, a hydroxymethyl group, a hydroxyethyl group, or an aryl group with or without a substituent.)

To be more specific, preferably, the compound includes at least one selected from the group consisting of a 1,3-diketone compound represented by the following Formula (2) and a 1,4-diketone compound represented by the following Formula (3), which include $R_1$ having two or less carbon atoms in Formula (1).

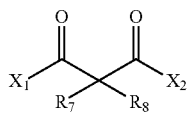

(2)

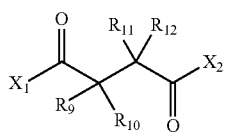

(3)

(Herein, in Formula (2) and Formula (3), $R_7$, $R_8$, $R_9$, $R_{10}$, $R_{11}$ and $R_{12}$, independently, represent a hydrogen atom, a halogen atom, a linear, branched, or cyclic alkyl group having 1 to 10 carbon atoms with or without a substituent, a hydroxymethyl group, a hydroxyethyl group, or an aryl group having 6 to 20 carbon atoms with or without a substituent, and $X_1$ and $X_{2i}$ independently, represent a hydrogen atom, a halogen atom, a linear, branched, or cyclic alkyl group having 1 to 10 carbon atoms with or without a substituent, a hydroxymethyl group, a hydroxyethyl group, or an aryl group having 6 to 20 carbon atoms with or without a substituent, a functional group (1) below, or a functional group (2) below. Herein, one or more sets from $R_9$ and $X_1$, $R_9$ and $R_{10}$, $R_{11}$ and $R_{12}$, and $R_{12}$ and $X_2$ may be bonded directly or through a carbon atom so as to form a cyclic structure.)

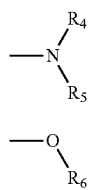

Functional group (1)

Functional group (2)

(Herein, $R_4$ and $R_5$ of the functional group (1) and $R_6$ of the functional group (2), independently, represent a hydrogen atom, a halogen atom, a linear, branched, or cyclic alkyl group having 1 to 10 carbon atoms with or without a substituent, a hydroxymethyl group, a hydroxyethyl group, or an aryl group having 6 to 20 carbon atoms with or without a substituent.

If the anticorrosive agent contained in the polishing composition is a 1,3-diketone compound represented by Formula (2) among the compounds in which two or more carbonyl groups contained in a molecule are bonded through a carbon atom, specifically, examples of the 1,3-diketone compound may include a β-diketone compound, a β-ketoamide compound, a β-ketoester compound, and the like. More specifically, examples of the 1,3-diketone compound may include acetylacetone, 3-methyl-2,4-pentanedione, 3-ethyl-2,4-pentanedione, 3,5-heptanedione, 6-methyl-2,4-heptanedione, 2,6-dimethyl-3,5-heptanedione, 2,2,6,6-tetramethyl heptane-3,5-dione, 2-acetyl cyclopentanone, 3-chloro acetylacetone, trifluoro acetylacetone, 2,4-hexanedione, benzoyl acetone, benzoyl trifluoro acetone, dibenzoyl methane, N,N-dimethyl acetoacetamide, N,N-diethyl acetoacetamide, N,N-dimethyl-2-chloro acetoacetamide, 1,3-diethoxypropane-1,3-dione, N,N-dimethyl-4-oxopentaneamide, 5-oxo caproic acid methyl, diacetoacetic acid ethyl, N-methyl acetoacetic acid amide, N,N-dimethyl acetoacetic acid amide, N-(2-hydroxy ethyl) acetoaceticacidamide, acetoaceticacidanilide, N-(2-methyl phenyl) acetoacetic acid amide, N-(4-methoxy phenyl) acetoacetic acid amide, N-(4-chloro phenyl) acetoacetic acid amide, 3-oxopentanoic acid amide, acetoacetic acid methyl, acetoacetic acid ethyl, acetoacetic acid octyl, acetoacetic acid oleyl, acetoacetic acid lauryl, acetoacetic acid stearyl, acetoacetic acid oleyl, acetoacetic acid benzyl, 3-oxopentanoic acid methyl, 3-oxopentanoic acid octyl, and the like.

Further, if the anticorrosive agent contained in the polishing composition is a 1,4-diketone compound represented by Formula (3) among the compounds in which two or more carbonyl groups contained in a molecule are bonded through a carbon atom, specifically, examples of the 1,4-diketone compound may include a γ-diketone compound and the like. More specifically, examples of the 1,4-diketone compound may include furoyl acetone, acetonyl acetone, phenacyl acetone, 2,5-hexanedione, 1,4-diphenyl-1,4-butanedione, 1-phenyl-1,4-pentanedione, 1,5-diphenyl-1,4-pentandione, 1,4-bis(4-methyl phenyl)-1,4-butanedione, 1,4-bis(4-methoxy phenyl)-1,4-butanedione, 1,4-bis(4-chloro phenyl)-1,4-butanedione, and the like.

Furthermore, in addition to the diketone compounds represented by Formula (2) and Formula (3), the diketone compounds represented by Formula (1) may include, for example, 2,6-heptanedione, 2,7-octanedione, 3-methyl-3-isopropyl-2,6-heptanedione, 3-acetyl heptane-2,6-dione, 3-methylene-2,6-heptanedione, 1-phenyl-1,5-heptanedione, 1-phenyl-3,6,6-trimethyl-1,5-heptanedione, 1-cyclo hexyl-6-hydroxy-6-methyl-1,5-heptanedione, and the like.

Among them, preferably, the compound includes at least one selected from the group consisting of diketone compounds in which at least one of $X_1$ and $X_2$ of Formula (1) to Formula (3) is a linear, branched, or cyclic alkyl group having 4 or more carbon atoms with or without a substituent, a hydroxymethyl group, or a hydroxyethyl group. Further, preferably, the compound includes at least one selected from the group consisting of diketone compounds in which $R_2$ to $R_{12}$ of Formula (1) to Formula (3), independently, are a hydrogen atom or a halogen atom. These compounds may be used alone or in combination of two or more.

An other example of the compound in which two or more carbonyl groups contained in a molecule are bonded through a carbon atom may include, preferably, a triketone compound represented by the following Formula (4).

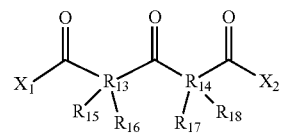

(4)

(Herein, in Formula (4), $R_{13}$ and $R_{14}$, independently, represent a linear or branched alkylene group having 1 to 4 carbon atoms, $R_{15}$, $R_{16}$, $R_{17}$, and $R_{18}$, independently, represent a hydrogen atom, a halogen atom, a linear, branched, or cyclic alkyl group having 1 to 10 carbon atoms with or without a substituent, a hydroxymethyl group, a hydroxyethyl group, or an aryl group having 6 to 20 carbon atoms with or without a substituent, and $X_1$ and $X_2$, independently, represent a hydrogen atom, a halogen atom, a linear, branched, or cyclic alkyl group having 1 to 10 carbon atoms with or without a substituent, a hydroxymethyl group, a hydroxyethyl group, or an aryl group having 6 to 20 carbon atoms with or without a substituent, a functional group (1) below, or a functional group (2) below. Herein, one or more sets from $X_1$ and $R_{15}$, $R_{15}$ and $R_{16}$, $R_{16}$ and $R_{17}$, $R_{17}$ and $R_{18}$, and $R_{18}$ and $X_2$ may be bonded directly or through a carbon atom so as to form a cyclic structure.)

Functional group (1)

Functional group (2)

(Herein, $R_4$ and $R_5$ of the functional group (1) and $R_6$ of the functional group (2), independently, represent a hydrogen atom, a halogen atom, a linear, branched, or cyclic alkyl group having 1 to 10 carbon atoms with or without a substituent, a hydroxymethyl group, a hydroxyethyl group, or an aryl group having 6 to 20 carbon atoms with or without a substituent.)

To be more specific, examples of the triketone compound represented by Formula (4) may include, preferably, 2,4,6-heptanetrione, 2,4,7-octanetrione, and the like.

Meanwhile, examples of the halogen atom used as $R_2$ to $R_{12}$, $R_{15}$ to $R_{18}$, and $X_1$ to $X_2$ of Formula (1) to Formula (4) and the functional groups (1) and (2) may include a fluorine atom, a chlorine atom, a bromine atom, and an iodine atom.

The alkyl group or aryl group used as $R_2$ to $R_{12}$, $R_{15}$ to $R_{18}$, and $X_1$ to $X_2$ of Formula (1) to Formula (4) and the functional groups (1) and (2) may have a substituent. Examples of the substituent may include an alkyl group, an aryl group, an aralkyl group, an alkoxy group, an aryloxy group, a halogen atom (Cl, Br, F), an alkoxy carbonyl group, an alkylthio group, an arylthio group, an amino group, a substituted amino group, an amide group, a sulfone amide group, an ureido group, a substituted ureido group, a carbamoyl group, a substituted carbamoyl group, a sulfamoyl group, a substituted sulfamoyl group, an alkyl sulfonyl group, an aryl sulfonyl group, a hydroxyl group, a cyano group, a nitro group, a sulfo group, a carboxyl group, and the like. Meanwhile, the substituent which is present if necessary cannot be the same as $R_2$ to $R_{12}$, $R_{15}$ to $R_{18}$, and $X_1$ to $X_2$ of Formula (1) to Formula (4) and the functional groups (1) and (2). For example, if $R_2$ to $R_{12}$, $R_{15}$ to $R_{18}$, and $X_1$ to $X_2$ are alkyl groups, they are not substituted with an additional alkyl group.

If the anticorrosive agent in the polishing composition is a compound in which two or more carbonyl groups contained in a molecule are bonded through a carbon atom in the molecule, an upper limit of an amount thereof is preferably 10 wt % or less, more preferably 8 wt % or less, and still more preferably 5 wt % or less. As an amount of the compound in which two or more carbonyl groups contained in a molecule are bonded through a carbon atom is decreased, a polishing speed is improved, which is preferable.

If the anticorrosive agent in the polishing composition is a compound in which two or more carbonyl groups contained in a molecule are bonded through a carbon atom in the molecule, a lower limit of an amount thereof is preferably 0.0001 wt % or more, more preferably 0.001 wt % or more, and still more preferably 0.005 wt % or more. As an amount of the compound in which two or more carbonyl groups contained in a molecule are bonded through a carbon atom in the molecule is increased, etching is suppressed. As a result, formation of a stepped portion caused by etching can be suppressed, which is preferable.

According to the present exemplary embodiment, the following effects can be obtained.

In the polishing composition according to the present exemplary embodiment, formation of a stepped portion caused by etching at a surface of the polishing object is suppressed. Therefore, there is used an anticorrosive agent that makes an interaction with the portion that contains the group IV material in the polishing object. For this reason, this polishing composition is preferably used for polishing a polishing object including a portion that contains a group IV material.

The above-described exemplary embodiment may be modified as follows.

The polishing composition according to the above-described exemplary embodiment may contain two or more kinds of oxidizing agents.

The polishing composition according to the above-described exemplary embodiment may contain two or more anticorrosive agents. For example, a combination of a compound in which two or more carbonyl groups contained in a molecule are bonded through a carbon atom in the molecule with a nitrogen-containing compound as another anticorrosive agent may be used. Further, examples of the nitrogen-containing compound may include an amine compound or a nitrogen-containing heterocyclic compound, and the nitrogen-containing heterocyclic compound is preferable. Specific examples of the nitrogen-containing heterocyclic compound may include pyrrole, pyrazole, imidazole, triazole, tetrazole, pyridine, pyrazine, pyridazine, pyrinezine, indolizine, indole, isoindole, indazole, purine, quinolizine, quinoline, isoquinoline, naphthylidine, phthalazine, quinoxaline, quinazoline, cinnoline, buterizine, thiazole, isothiazole, oxazole, isooxazole, furazane, and the like. Examples of the pyrazole may include 1H-pyrazole, 4-nitro-3-pyrazole carboxylic acid, 3,5-pyrazole carboxylic acid, 3-amino-5-phenyl pyrazole, 5-amino-3-phenyl pyrazole, 3,4,5-tribromo pyrazole, 3-amino pyrazole, 3,5-dimethyl pyrazole, 3,5-dimethyl-1-hydroxy methylpyrazole, 3-methylpyrazole, 1-methylpyrazole, 3-amino-5-methylpyrazole, 4-amino-pyrazolo-[3,4-d]pyrimidine, allopurinol, 4-chloro-1H-pyrazolo-[3,4-D]pyrimidine, 3,4-dihydroxy-6-methylpyrazolo-(3,4-B)-pyridine, 6-methyl-1H-pyrazolo-[3,4-b]pyridine-3-amine, and the like. Examples of the imidazole may include imidazole, 1-methyl imidazole, 2-methyl imidazole, 4-methyl imidazole, 1,2-dimethylpyrazole, 2-ethyl-4-methyl imidazole, 2-isopropyl imidazole, benzo imidazole, 5,6-dimethyl benzo imidazole, 2-amino benzoimidazole, 2-chlorobenzoimidazole, 2-methylbenzoimidazole, 2-(1-hydroxyethyl)benzimidazole, 2-hydroxybenz imidazole, 2-phenylbenz imidazole, 2,5-dimethylbenz imidazole, 5-methylbenzo imidazole, 5-nitrobenz imidazole, 1H-purine, and the like. Examples of the triazole may include 1,2,3-triazole, 1,2,4-triazole, 1-methyl-1,2,4-triazole, methyl-1H-1,2,4-triazole-3-carboxylate, 1,2,4-triazole-3-carboxylic acid, 1,2,4-triazole-3-carboxylic acid methyl, 1H-1,2,4-triazole-3-thiol, 3,5-diamino-1H-1,2,4-triazole, 3-amino-1,2,4-triazole-5-thiol, 3-amino-1H-1,2,4-triazole, 3-amino-5-benzyl-4H-1,2,4-triazole, 3-amino-5-methyl-4H-1,2,4-triazole, 3-nitro-1,2,4-triazole, 3-bromo-5-nitro-1,2,4-triazole, 4-(1,2,4-triazole-1-yl)phenol, 4-amino-1,2,4-triazole, 4-amino-3,5-dipropyl-4H-1,2,4-triazole, 4-amino-3,5-dimethyl-4H-1,2,4-triazole, 4-amino-3,5-dipeptyl-4H-1,2,4-triazole, 5-methyl-1,2,4-triazole-3,4-diamine, 1H-benzo triazole, 1-hydroxybenzo triazole, 1-aminobenzo triazole, 1-carboxybenzo triazole, 5-chloro-1H-benzo triazole, 5-nitro-1H-benzo triazole, 5-carboxy-1H-benzo triazole, 5-methyl-1H-benzo triazole, 5,6-dimethyl-1H-benzo triazole, 1-(1',2'-dicarboxyethyl)benzo triazole, 1-[N,N-bis(hydroxyethyl)aminomethyl]benzo triazole, 1-[N,N-bis(hydroxyethyl)aminomethyl]-5-methylbenzotriazole, and the like. Examples of the tetrazole may include 1H-tetrazole, 5-methyl tetrazole, 5-amino tetrazole, 5-phenyl tetrazole, and the like. Examples of the indazole may include 1H-indazole, 5-amino-1H-indazole, 5-nitro-1H-indazole, 5-hydroxy-1H-indazole, 6-amino-1H-indazole, 6-nitro-1H-indazole, 6-hydroxy-1H-indazole, 3-carboxy-5-methyl-1H-indazole, and the like. Examples of the indole may include 1H-indole, 1-methyl-1H-indole, 2-methyl-1H-indole, 3-methyl-1H-indole, 4-methyl-1H-indole, 5-methyl-1H-indole, 6-methyl-1H-indole, 7-methyl-1H-indole, 4-amino-1H-indole, 5-amino-1H-indole, 6-amino-1H-indole, 7-amino-1H-indole, 4-hydroxy-1H-indole, 5-hydroxy-1H-indole, 6-hydroxy-1H-indole, 7-hydroxy-1H-indole, 4-methoxy-1H-indole, 5-methoxy-1H-indole, 6-methoxy-1H-indole, 7-methoxy-1H-indole, 4-chloro-1H-indole, 5-chloro-1H-indole, 6-chloro-1H-indole, 7-chloro-1H-indole, 4-carboxy-1H-indole, 5-carboxy-1H-indole, 6-carboxy-1H-indole, 7-carboxy-1H-indole, 4-nitro-1H-indole, 5-nitro-1H-indole, 6-nitro-1H-indole, 7-nitro-1H-indole, 4-nitrile-1H-indole, 5-nitrile-1H-indole, 6-nitrile-1H-indole, 7-nitrile-1H-indole, 2,5-dimethyl-1H-indole, 1,2-dimethyl-1H-indole, 1,3-dimethyl-1H-indole, 2,3-dimethyl-1H-indole, 5-amino-2,3-dimethyl-1H-indole, 7-ethyl-1H-indole, 5-(aminomethyl)indole, 2-methyl-5-amino-1H-indole, 3-hydroxymethyl-1H-indole, 6-isopropyl-1H-indole, 5-chloro-2-methyl-1H-indole, and the like. Among them, 1H-1,2,4-triazole or benzotriazole is preferable.

The polishing composition according to the above-described exemplary embodiment may further contain abrasive grains. The abrasive grains may be any one of inorganic particles or organic particles. Specific examples of the inorganic particles may include particles of metal oxides such as silica, alumina, ceria, titania, and the like. Specific examples of the organic particles may include polymethacrylic acid methyl particles. Among them, silica particles are preferable, and colloidal silica is particularly preferable.

The abrasive grains may be surface-modified. Typical colloidal silica has a zeta potential value close to zero under acidic conditions, and thus, silica particles do not electrically repel each other under acidic conditions and aggregation may easily occur. Meanwhile, the abrasive grains which are surface-modified such that a zeta potential has a relatively high positive or negative value even under acidic conditions, silica particles strongly repel each other and disperse well even under acidic conditions, thereby improving storage stability of the polishing composition. Such surface-modified abrasive grains can be obtained by mixing metals such as aluminium, titanium, or zirconium or oxides thereof with abrasive grains and doping surfaces of the abrasive grains.

Otherwise, the surface-modified abrasive grains in the polishing composition may be organic acid-immobilized silica. Particularly, organic acid-immobilized colloidal silica is preferable. Immobilization of organic acid in colloidal silica is carried out by chemically bonding a functional group of the organic acid to a surface of the colloidal silica. When the colloidal silica simply coexists with the organic acid, such immobilization of the organic acid in the colloidal silica cannot be achieved. If sulfonic acid as one kind of organic acid is immobilized in colloidal silica, immobilization can be carried out by the method as described in, for example, "Sulfonic acid-functionalized silica through quantitative oxidation of thiol groups", Chem. Commun. 246-247 (2003). To be specific, after a silane coupling agent including a thiol group such as 3-mercaptopropyl trimethoxysilane or the like is coupled to colloidal silica, the thiol is oxidized with hydrogen peroxide, so that sulfonic acid-immobilized colloidal silica can be obtained. Otherwise, if carboxylic acid is immobilized in colloidal silica, immobilization can be carried out by the method as described in, for example, "Novel Silane Coupling Agents Containing a Photolabile 2-Nitrobenzyl Ester for Introduction of a Carboxy Group on the Surface of Silica Gel", Chemistry Letters, 3, 228-229 (2000). To be specific, after a silane coupling agent including a photoreactive 2-nitro benzyl ester is coupled to colloidal silica, light is irradiated thereto, so that carboxylic acid-immobilized colloidal silica can be obtained.

An amount of the abrasive grains contained in the polishing composition is preferably 0.1% by mass or more, more preferably 0.5% by mass or more, and still more preferably 1% by mass or more. As an amount of the abrasive grains is increased, a speed of polishing of a polishing object including a portion that contains a group IV material with the polishing material is improved.

Further, an amount of the abrasive grains contained in the polishing composition is preferably 20% by mass or less, more preferably 15% by mass or less, and still more preferably 10% by mass or less. As an amount of the abrasive grains is decreased, the cost of materials of the polishing composition can be reduced and also, aggregation of the abrasive grains hardly occurs. Furthermore, since the polishing object including a portion that contains a group IV material is polished with the polishing material, a polished surface with few scratches can be easily obtained.

The polishing composition according to the above-described exemplary embodiment may contain water as a dispersion medium or a solvent for dispersing or dissolving each component. Water that contains as few impurities as possible is preferable in order not to inhibit actions of the other components. To be specific, pure water, ultrapure water, or distilled water obtained by removing impurity ions by using an ion exchange resin and then removing impurities through a filter.

The polishing composition according to the above-described exemplary embodiment may be pH-adjusted to be acidic or alkaline. A lower limit of pH is not specifically limited, and may be preferably 3 or more, more preferably or more, and still more preferably 6 or more. If pH is high, it is preferable in that a high polishing speed can be obtained while an etching rate is suppressed. Further, an upper limit of pH is not specifically limited, and may be preferably 12 or less, more preferably 11 or less, and still more preferably 10 or less. If pH is too high, the abrasive grains such as the colloidal silica may be dissolved. Therefore, when pH is low, it is possible to suppress dissolution of the abrasive grains such as the colloidal silica. Therefore, it is preferable in that storage stability of slurry is improved. As a pH adjuster, publicly-known organic acids, organic bases, inorganic acids, inorganic bases, or salts thereof may be used.

The polishing composition according to the above-described exemplary embodiment may further contain a publicly-known additive such as a preservative if necessary.

The polishing composition according to the above-described exemplary embodiment may be one-pack type or multi-pack type such as two-pack type.

The polishing composition according to the above-described exemplary embodiment may be prepared by diluting a stock solution of the polishing composition with water.

[Polishing Method and Substrate Manufacturing Method]

As described above, the polishing composition of the present invention is preferably used for polishing a polishing object including a portion that contains a group IV material. Therefore, the present invention provides a polishing method of polishing the polishing object including a portion that contains a group IV material with the polishing composition of the present invention. Further, the present invention provides a manufacturing method of a substrate including polishing the polishing object including a portion that contains a group IV material by the above-described polishing method.

As a polishing machine, there may be used a general polishing machine having a holder configured to hold a substrate or the like including a polishing object, a motor of which the number of revolutions can be changed, and a polishing plate to which a polishing pad (abrasive cloth) can be attached.

As the polishing pad, general non-woven fabric, polyurethane, and porous fluorine resin may be used without specific limitation. Preferably, the polishing pad may be groove-processed to reserve a polishing liquid.

Polishing conditions are not specifically limited. For example, a speed of revolution of the polishing plate is preferably 10 to 500 rpm, and a pressure (polishing pressure) applied to the substrate including the polishing object is preferably 0.5 to 10 psi. A method of supplying the polishing composition to the polishing pad is not specifically limited. For example, there may be used a method of continuously supplying the polishing composition by a pump or the like. An amount of the polishing composition supplied is not limited, and preferably, a surface of the polishing pad may be continuously covered with the polishing composition of the present invention.

After the polishing process is ended, the substrate is washed with flowing water and water drops on the substrate are spin-dried by a spin drier, so that the substrate including a portion that contains a group IV material can be obtained.

EXAMPLES

Hereinafter, Examples and Comparative Examples of the present invention will be explained.

Polishing compositions of Examples 1 to 60 and Comparative Examples 1 to 6 were prepared by mixing an oxidizing agent and an anticorrosive agent with water. In the column for "Kind" in the column for "Anticorrosive agent" in Table 1 to Table 3, "Kind" represents a kind of an anticorrosive agent contained in each polishing composition. Further, in the column for "Content (mol/L)" and the column for "Content (wt %)", "Content (mol/L)" and "Content (wt %)" represent a content of a corresponding anticorrosive agent or other additive in the polishing composition. Meanwhile, "Content (wt %)" was calculated with respect to the specific gravity of the polishing composition as 1. In the same column, "-" means that a corresponding anticorrosive agent or other additive is not contained. In the column for "pH" in Table 1 to Table 3, "pH" represents a pH of each polishing composition. Meanwhile, although not listed in Tables 1 to 3, each polishing composition contains colloidal silica (average secondary particle diameter of about 60 nm, average primary particle diameter of about 30 nm) as abrasive grains in an amount of 1.0 wt %. Further, sodium hypochlorite as an oxidizing agent was added to each polishing composition so as to be in an amount of 0.1 wt % (about 0.0134 mol/L, calculated with respect to the specific gravity of 1 of the polishing composition), and a pH was adjusted to a certain value by adding inorganic acids or inorganic bases thereto.

A germanium blanket wafer was cut into small wafer pieces having a size of 2 cm square and then immersed in each of the polishing compositions of Examples 1 to 60 and Comparative Examples 1 to 6 at 25° C. for 5 minutes. A germanium etching rate converted from a difference in weight of a small wafer piece between before and after immersion and the specific gravity (6.2 g/cm$^3$) of the germanium was as listed in the column for "Dissolution rate of Ge" in the column for "Evaluation 1" in Table 1 to Table 3. Further, the germanium blanket wafer was polished under the conditions as listed in Table 4. A polishing speed at the time when the germanium blanket wafer was polished under the conditions as listed in Table 4 for a certain time was obtained by calculating a difference in thickness of the blanket wafer between before and after polishing through measurement of a sheet resistance by a direct current four-point probe method and dividing the difference by a polishing time. A result thereof was as listed in the column for "Polishing speed of Ge" in the column for "Evaluation 1" in Tables 1 to 3.

Likewise, a silicon germanium blanket wafer was cut into small wafer pieces having a size of 2 cm square and then immersed in each of the polishing compositions of Examples 1 to 60 and Comparative Examples 1 to 6 at 25° C. for 5 minutes. A silicon germanium etching rate converted from a difference in weight of a small wafer piece between before and after immersion and the specific gravity (4.1 g/cm$^3$) of the silicon germanium was as listed in the column for "Etching rate of SiGe" in the column for "Evaluation 2" in Table 1 to Table 3. Further, the silicon germanium blanket wafer was polished under the conditions as listed in Table 4. A polishing speed at the time when the silicon germanium blanket wafer was polished under the conditions as listed in Table 4 for a certain time was obtained by calculating a difference in thickness of the blanket wafer between before and after polishing through measurement of a sheet resistance by the direct current four-point probe method and dividing the difference by a polishing time. A result thereof was as listed in the column for "Polishing speed of SiGe" in the column for "Evaluation 2" in Tables 1 to 3.

TABLE 1

| | Anticorrosive agent | | | | Evaluation 1 | | | Evaluation 2 | | |
|---|---|---|---|---|---|---|---|---|---|---|
| | Kind | Content [mol/L] | Content [wt %] | pH | Polishing speed of Ge [Å/min] | Dissolution rate of Ge [Å/min] | Polishing speed of Ge/ Dissolution rate of Ge | Polishing speed of SiGe [Å/min] | Dissolution rate of SiGe [Å/min] | Polishing speed of SiGe/ Dissolution rate of SiGe |
| Comparative Example 1 | — | — | — | 3 | 1030 | 620 | 1.7 | 420 | 240 | 1.8 |
| Comparative Example 2 | — | — | — | 7 | 1860 | 1260 | 1.5 | 1030 | 520 | 2.0 |
| Comparative Example 3 | — | — | — | 10 | 2140 | 1360 | 1.6 | 1180 | 580 | 2.0 |
| Example 1 | Acetyl acetone | 0.01 | 0.10 | 3 | 515 | 73 | 7.1 | 322 | 30 | 10.7 |
| Example 2 | Acetyl acetone | 0.01 | 0.10 | 7 | 745 | 86 | 8.7 | 570 | 37 | 15.4 |
| Example 3 | Acetyl acetone | 0.01 | 0.10 | 10 | 860 | 95 | 9.1 | 640 | 38 | 16.8 |
| Example 4 | 3-methyl2,4-pentanedione | 0.01 | 0.11 | 3 | 532 | 207 | 2.6 | 324 | 31 | 10.5 |
| Example 5 | 3-methyl2,4-pentanedione | 0.01 | 0.11 | 7 | 893 | 267 | 3.3 | 575 | 38 | 15.1 |
| Example 6 | 3-methyl2,4-pentanedione | 0.01 | 0.11 | 10 | 1027 | 285 | 3.6 | 656 | 36 | 18.2 |
| Example 7 | 3-ethyl2,4-pentanedione | 0.01 | 0.13 | 3 | 510 | 217 | 2.4 | 323 | 29 | 11.1 |
| Example 8 | 3-ethyl2,4-pentanedione | 0.01 | 0.13 | 7 | 744 | 213 | 3.5 | 580 | 38 | 15.3 |
| Example 9 | 3-ethyl2,4-pentanedione | 0.01 | 0.13 | 10 | 856 | 219 | 3.9 | 644 | 40 | 16.1 |

TABLE 1-continued

| | Anticorrosive agent | | | | Evaluation 1 | | | Evaluation 2 | | |
|---|---|---|---|---|---|---|---|---|---|---|
| | Kind | Content [mol/L] | Content [wt %] | pH | Polishing speed of Ge [Å/min] | Dissolution rate of Ge [Å/min] | Polishing speed of Ge/ Dissolution rate of Ge | Polishing speed of SiGe [Å/min] | Dissolution rate of SiGe [Å/min] | Polishing speed of SiGe/ Dissolution rate of SiGe |
| Example 10 | 2-acetyl cyclopentanone | 0.01 | 0.13 | 3 | 545 | 221 | 2.5 | 351 | 31 | 11.3 |
| Example 11 | 2-acetyl cyclopentanone | 0.01 | 0.13 | 7 | 778 | 225 | 3.5 | 572 | 36 | 15.9 |
| Example 12 | 2-acetyl cyclopentanone | 0.01 | 0.13 | 10 | 895 | 245 | 3.7 | 660 | 36 | 18.3 |
| Example 13 | 3-chloro acetyl acetone | 0.01 | 0.13 | 3 | 520 | 75 | 6.9 | 355 | 32 | 11.1 |
| Example 14 | 3-chloro acetyl acetone | 0.01 | 0.13 | 7 | 741 | 83 | 8.9 | 591 | 39 | 15.2 |
| Example 15 | 3-chloro acetyl acetone | 0.01 | 0.13 | 10 | 834 | 92 | 9.1 | 654 | 41 | 16.0 |
| Example 16 | 2,4,6-heptanetrione | 0.01 | 0.14 | 3 | 498 | 55 | 9.1 | 312 | 31 | 10.1 |
| Example 17 | 2,4,6-heptanetrione | 0.01 | 0.14 | 7 | 714 | 75 | 9.5 | 569 | 38 | 15.0 |
| Example 18 | 2,4,6-heptanetrione | 0.01 | 0.14 | 10 | 831 | 86 | 9.7 | 636 | 36 | 17.7 |
| Example 19 | 3,5-heptanedione | 0.01 | 0.13 | 3 | 520 | 22 | 23.6 | 321 | 1 | 321 |
| Example 20 | 3,5-heptanedione | 0.01 | 0.13 | 7 | 739 | 28 | 26.4 | 572 | 1 | 572 |

TABLE 2

Continuation of Table 1

| | Anticorrosive agent | | | | Evaluation 1 | | | Evaluation 2 | | |
|---|---|---|---|---|---|---|---|---|---|---|
| | Kind | Content [mol/L] | Content [wt %] | pH | Polishing speed of Ge [Å/min] | Dissolution rate of Ge [Å/min] | Polishing speed of Ge/ Dissolution rate of Ge | Polishing speed of SiGe [Å/min] | Dissolution rate of SiGe [Å/min] | Polishing speed of SiGe/ Dissolution rate of SiGe |
| Example 21 | 3,5-heptanedione | 0.01 | 0.13 | 10 | 837 | 38 | 22.0 | 659 | 1 | 659 |
| Example 22 | 6-methyl-2,4-heptanedione | 0.01 | 0.14 | 3 | 515 | 1 | 515.0 | 323 | 1 | 323 |
| Example 23 | 6-methyl-2,4-heptanedione | 0.01 | 0.14 | 7 | 744 | 1 | 744.0 | 572 | 1 | 572 |
| Example 24 | 6-methyl-2,4-heptanedione | 0.01 | 0.14 | 10 | 856 | 1 | 856.0 | 656 | 1 | 656 |
| Example 25 | 2,6-dimethyl-3,5-heptanedione | 0.01 | 0.16 | 3 | 515 | 1 | 515.0 | 313 | 1 | 313 |
| Example 26 | 2,6-dimethyl-3,5-heptanedione | 0.01 | 0.16 | 7 | 744 | 1 | 744.0 | 567 | 1 | 567 |
| Example 27 | 2,6-dimethyl-3,5-heptanedione | 0.01 | 0.16 | 10 | 856 | 1 | 856.0 | 642 | 1 | 642 |
| Example 28 | 2,2,6,6-tetramethyl-heptane-3,5-dione | 0.01 | 0.18 | 3 | 515 | 1 | 515.0 | 308 | 1 | 308 |
| Example 29 | 2,2,6,6-tetramethyl-heptane-3,5-dione | 0.01 | 0.18 | 7 | 744 | 1 | 744.0 | 567 | 1 | 567 |
| Example 30 | 2,2,6,6-tetramethyl-heptane-3,5-dione | 0.01 | 0.18 | 10 | 856 | 1 | 856.0 | 642 | 1 | 642 |
| Example 31 | 2,5-hexanedione | 0.01 | 0.11 | 3 | 567 | 119 | 4.8 | 397 | 37 | 10.7 |
| Example 32 | 2,5-hexanedione | 0.01 | 0.11 | 7 | 744 | 163 | 4.6 | 543 | 57 | 9.5 |
| Example 33 | 2,5-hexanedione | 0.01 | 0.11 | 10 | 920 | 189 | 4.9 | 690 | 60 | 11.5 |
| Example 34 | 2,6-heptanedione | 0.01 | 0.13 | 3 | 737 | 238 | 3.1 | 510 | 47 | 10.9 |
| Example 35 | 2,6-heptanedione | 0.01 | 0.13 | 7 | 967 | 326 | 3.0 | 712 | 68 | 10.5 |
| Example 36 | 2,6-heptanedione | 0.01 | 0.13 | 10 | 1196 | 378 | 3.2 | 787 | 78 | 10.1 |
| Example 37 | 2,7-octanedione | 0.01 | 0.14 | 3 | 640 | 218 | 2.9 | 510 | 47 | 10.9 |
| Example 38 | 2,7-octanedione | 0.01 | 0.14 | 7 | 825 | 308 | 2.7 | 602 | 57 | 10.6 |
| Example 39 | 2,7-octanedione | 0.01 | 0.14 | 10 | 930 | 342 | 2.7 | 679 | 63 | 10.8 |
| Example 40 | Dimethyl acetoacetamide | 0.01 | 0.13 | 3 | 522 | 21 | 24.9 | 355 | 32 | 11.1 |
| Example 41 | Dimethyl acetoacetamide | 0.01 | 0.13 | 7 | 743 | 28 | 26.5 | 591 | 40 | 14.8 |
| Example 42 | Dimethyl acetoacetamide | 0.01 | 0.13 | 10 | 832 | 36 | 23.1 | 654 | 42 | 15.6 |
| Example 43 | N,N-dimethyl-2-chloro acetoacetamide | 0.01 | 0.16 | 3 | 512 | 24 | 21.3 | 323 | 39 | 8.3 |

TABLE 2-continued

Continuation of Table 1

| | Anticorrosive agent | | | | Evaluation 1 | | | Evaluation 2 | | |
|---|---|---|---|---|---|---|---|---|---|---|
| | Kind | Content [mol/L] | Content [wt %] | pH | Polishing speed of Ge [Å/min] | Dissolution rate of Ge [Å/min] | Polishing speed of Ge/ Dissolution rate of Ge | Polishing speed of SiGe [Å/min] | Dissolution rate of SiGe [Å/min] | Polishing speed of SiGe/ Dissolution rate of SiGe |
| Example 44 | N,N-dimethyl-2-chloro acetoacetamide | 0.01 | 0.16 | 7 | 761 | 33 | 23.1 | 572 | 44 | 13.0 |
| Example 45 | N,N-dimethyl-2-chloro acetoacetamide | 0.01 | 0.16 | 10 | 883 | 38 | 23.2 | 656 | 38 | 17.3 |

TABLE 3

Continuation of Table 1 and Table 2

| | Anticorrosive agent | | | | Evaluation 1 | | | Evaluation 2 | | |
|---|---|---|---|---|---|---|---|---|---|---|
| | Kind | Content [mol/L] | Content [wt %] | pH | Polishing speed of Ge [Å/min] | Dissolution rate of Ge [Å/min] | Polishing speed of Ge/ Dissolution rate of Ge | Polishing speed of SiGe [Å/min] | Dissolution rate of SiGe [Å/min] | Polishing speed of SiGe/ Dissolution rate of SiGe |
| Example 46 | Dimethyl acetoacetamide | 0.01 | 0.13 | 3 | 519 | 1 | 519 | 323 | 1 | 323 |
| Example 47 | Dimethyl acetoacetamide | 0.01 | 0.13 | 7 | 764 | 1 | 764 | 572 | 1 | 572 |
| Example 48 | Dimethyl acetoacetamide | 0.01 | 0.13 | 10 | 886 | 1 | 886 | 656 | 1 | 656 |
| Example 49 | 1,3-diethoxypropane-1,3-dione | 0.01 | 0.16 | 3 | 520 | 1 | 520 | 312 | 1 | 312 |
| Example 50 | 1,3-diethoxypropane-1,3-dione | 0.01 | 0.16 | 7 | 741 | 1 | 741 | 561 | 1 | 561 |
| Example 51 | 1,3-diethoxypropane-1,3-dione | 0.01 | 0.16 | 10 | 842 | 1 | 842 | 645 | 1 | 645 |
| Example 52 | N,N-dimethyl-4-oxo-pentane amide | 0.01 | 0.14 | 3 | 561 | 102 | 5.5 | 390 | 37 | 10.5 |
| Example 53 | N,N-dimethyl-4-oxo-pentane amide | 0.01 | 0.14 | 7 | 746 | 145 | 5.1 | 543 | 52 | 10.4 |
| Example 54 | N,N-dimethyl-4-oxo-pentane amide | 0.01 | 0.14 | 10 | 915 | 167 | 5.5 | 680 | 59 | 11.5 |
| Example 55 | 5-oxo caproic acid methyl | 0.01 | 0.14 | 3 | 740 | 214 | 3.5 | 512 | 47 | 10.9 |
| Example 56 | 5-oxo caproic acid methyl | 0.01 | 0.14 | 7 | 970 | 301 | 3.2 | 710 | 66 | 10.8 |
| Example 57 | 5-oxo caproic acid methyl | 0.01 | 0.14 | 10 | 1185 | 335 | 3.5 | 790 | 77 | 10.3 |
| Example 58 | Diacetoacetic acid ethyl | 0.01 | 0.17 | 3 | 505 | 214 | 2.4 | 323 | 29 | 11.1 |
| Example 59 | Diacetoacetic acid ethyl | 0.01 | 0.17 | 7 | 731 | 213 | 3.4 | 561 | 38 | 14.8 |
| Example 60 | Diacetoacetic acid ethyl | 0.01 | 0.17 | 10 | 839 | 220 | 3.8 | 612 | 40 | 15.3 |
| Comparative Example 4 | Pipiridine | 0.3 | 2.55 | 3 | 2139 | 1819 | 1.2 | 1177 | 1000 | 1.2 |
| Comparative Example 5 | Pipiridine | 0.3 | 2.55 | 7 | 1273 | 1082 | 1.2 | 891 | 758 | 1.2 |
| Comparative Example 6 | Pipiridine | 0.3 | 2.55 | 10 | 1861 | 1582 | 1.2 | 1079 | 918 | 1.2 |

TABLE 4

Polishing conditions

| | |
|---|---|
| Polishing machine: | One-side CMP polishing machine |
| Polishing pad: | Polyurethane-based polishing pad |
| Polishing pressure: | 1.2 psi (about 85 hPa) |
| Speed of revolution of plate: | 60 rpm |
| Polishing composition: | Disposable composition |
| Number of revolution of carrier: | 60 rpm |

As listed in Tables 1 to 3, as compared with the case of using the polishing compositions of Comparative Examples 1 to 6 which do not meet the requirement for the present invention, in the case of using the polishing compositions of Examples 1 to 60, a remarkably excellent effect of suppressing etching was observed. This result suggests that the polishing composition of the present invention is effective in suppressing formation of a stepped portion caused by etching.

The present application is based on JP 2012-061156 A which was filed on Mar. 16, 2012, and content of the disclosure is incorporated herein by reference in its entirety.

The invention claimed is:

1. A polishing method comprising,
polishing a polishing object including a portion comprising germanium (Ge) with a polishing composition,
wherein the polishing composition comprises an oxidizing agent and an anticorrosive agent, and
wherein the anticorrosive agent comprises at least one selected from the group consisting of compounds in which two or more carbonyl groups contained in a molecule are bonded through a carbon atom in the molecule.

2. The method according to claim 1, wherein the compound is represented by the following Formula (4):

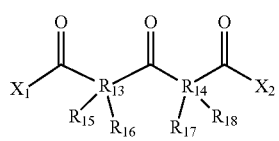

(4)

(wherein, in Formula (4), $R_{13}$ and $R_{14}$, independently, represent a linear or branched alkylene group having 1 to 4 carbon atoms,
$R_{15}$, $R_{16}$, $R_{17}$, and $R_{18}$, independently, represent a hydrogen atom, a halogen atom, a linear, branched, or cyclic alkyl group having 1 to 10 carbon atoms with or without a substituent, a hydroxymethyl group, a hydroxyethyl group, or an aryl group having 6 to 20 carbon atoms with or without a substituent, and
$X_1$ and $X_2$, independently, represent a hydrogen atom, a halogen atom, an alkyl group having 6 to 20 carbon atoms with or without a substituent, a hydroxymethyl group, a hydroxyethyl group, or an aryl group having 6 to 20 carbon atoms with or without a substituent, a functional group (1) below, or a functional group (2) below, wherein, one or more sets from $X_1$ and $R_{15}$, $R_{15}$ and $R_{16}$, $R_{16}$ and $R_{17}$, $R_{17}$ and $R_{18}$, and $R_{18}$ and $X_2$ may be bonded directly or through a carbon atom so as to form a cyclic structure),

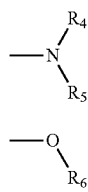

Functional group (1)

Functional group (2)

(wherein, $R_4$ and $R_5$ of the functional group (1) and $R_6$ of the functional group (2), independently, represent a hydrogen atom, a halogen atom, a linear, branched, or cyclic alkyl group having 1 to 10 carbon atoms with or without a substituent, a hydroxymethyl group, a hydroxyethyl group, or an aryl group having 6 to 20 carbon atoms with or without a substituent).

3. The method according to claim 1, wherein a pH is 5 or more to 12 or less.

4. A manufacturing method of a substrate including a portion comprising germanium, the manufacturing method comprising a polishing process by the polishing method described in claim 1.

5. The method according to claim 1, wherein the polishing object includes a portion comprising SiGe.

6. The method according to claim 1, wherein the compound is a diketone compound represented by the following Formula (1):

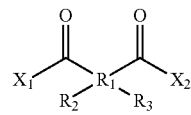

(1)

(wherein, in Formula (1),
$R_1$ represents a linear or branched alkylene group having 1 to 4 carbon atoms,
$R_2$ and $R_3$, independently, represent a hydrogen atom, a halogen atom, a linear, branched, or cyclic alkyl group having 1 to 10 carbon atoms with or without a substituent, a hydroxymethyl group, a hydroxyethyl group, or an aryl group having 6 to 20 carbon atoms with or without a substituent, and
$X_1$ and $X_2$, independently, represent a hydrogen atom, a halogen atom, a linear, branched, or cyclic alkyl group having 1 to 10 carbon atoms with or without a substituent, a hydroxymethyl group, a hydroxyethyl group, or an aryl group having 6 to 20 carbon atoms with or without a substituent, a functional group (1) below, or a functional group (2) below, wherein, one or more sets from $R_2$ and $X_1$, $R_2$ and $R_3$, and $R_3$ and $X_2$, may be bonded directly or through a carbon atom so as to form a cyclic structure),

Functional group (1)

Functional group (2)

(wherein, $R_4$ and $R_5$ of the functional group (1) and $R_6$ of the functional group (2), independently, represent a hydrogen atom, a halogen atom, a linear, branched, or cyclic alkyl group having 1 to 10 carbon atoms with or without a substituent, a hydroxymethyl group, a hydroxyethyl group, or an aryl group having 6 to 20 carbon atoms with or without a substituent).

7. The method according to claim 6, wherein the compound comprises at least one selected from the group consisting of diketone compounds represented by the following Formula (2) and diketone compounds represented by the following Formula (3), which comprise $R_1$ having two or less carbon atoms in Formula (1):

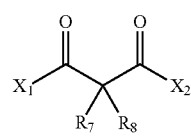

(2)

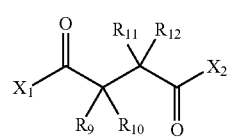

(3)

(wherein, in Formula (2) and Formula (3), $R_7$, $R_8$, $R_9$, $R_{10}$, $R_{11}$ and $R_{12}$, independently, represent a hydrogen atom, a halogen atom, a linear, branched, or cyclic alkyl group having 1 to 10 carbon atoms with or without a substituent, a hydroxymethyl group, a hydroxyethyl group, or an aryl group having 6 to 20 carbon atoms with or without a substituent, and $X_1$ and $X_2$, independently, represent a hydrogen atom, a halogen atom, a linear, branched, or cyclic alkyl group having 1 to 10 carbon atoms with or without a substituent, a hydroxymethyl group, a hydroxyethyl group, or an aryl group having 6 to 20 carbon atoms with or without a substituent, a functional group (1) below, or a functional group (2) below, wherein, one or more sets from $R_9$ and $X_1$, $R_9$ and $R_{10}$, $R_{11}$ and $R_{12}$, and $R_{12}$ and $X_2$ may be bonded directly or through a carbon atom so as to form a cyclic structure),

Functional group (1)

Functional group (2)

(wherein, $R_4$ and $R_5$ of the functional group (1) and $R_6$ of the functional group (2), independently, represent a hydrogen atom, a halogen atom, a linear, branched, or cyclic alkyl group having 1 to 10 carbon atoms with or without a substituent, a hydroxymethyl group, a hydroxyethyl group, or an aryl group having 6 to 20 carbon atoms with or without a substituent).

8. The method according to claim 6, wherein the compound comprises at least one selected from the group consisting of diketone compounds in which at least one of the $X_1$ and $X_2$ of Formula (1) to Formula (3) is a linear, branched, or cyclic alkyl group having 4 or more carbon atoms with or without a substituent, a hydroxymethyl group, or a hydroxyethyl group.

9. The method according to claim 6, wherein the compound comprises at least one selected from the group consisting of diketone compounds in which $R_2$ to $R_{12}$ of Formula (1) to Formula (3), independently, are a hydrogen atom or a halogen atom.

* * * * *